US012792333B2

(12) United States Patent
Pusapati et al.

(10) Patent No.: US 12,792,333 B2
(45) Date of Patent: Nov. 10, 2026

(54) SYSTEMS AND METHODS FOR COLD BOOT USING DIGITAL TWIN

(71) Applicant: Cisco Technology, Inc., San Jose, CA (US)

(72) Inventors: Radha Krishnaiah Pusapati, Fremont, CA (US); Shiv Prakash Saini, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 327 days.

(21) Appl. No.: 18/413,901

(22) Filed: Jan. 16, 2024

(65) Prior Publication Data

US 2025/0231754 A1 Jul. 17, 2025

(51) Int. Cl.

| | |
|---|---|
| ***G06F 13/28*** | (2006.01) |
| ***G06F 8/61*** | (2018.01) |
| ***G06F 8/65*** | (2018.01) |
| ***G06F 30/20*** | (2020.01) |
| ***H04L 41/082*** | (2022.01) |

(52) U.S. Cl.

CPC .................. *G06F 8/63* (2013.01); *G06F 8/65* (2013.01); *G06F 13/28* (2013.01); *G06F 30/20* (2020.01); *H04L 41/082* (2013.01)

(58) Field of Classification Search

CPC ... G06F 8/63; G06F 8/65; G06F 13/28; G06F 30/20; G06F 9/4401; H04L 41/082

See application file for complete search history.

(56) References Cited

U.S. PATENT DOCUMENTS

| | | | | |
|---|---|---|---|---|
| 2022/0014946 | A1 | 1/2022 | Merwaday et al. | |
| 2022/0038343 | A1 | 2/2022 | Dompe et al. | |
| 2022/0191648 | A1 | 6/2022 | Smith et al. | |
| 2022/0276809 | A1* | 9/2022 | Guy | G06F 3/0604 |
| 2023/0027152 | A1* | 1/2023 | Doshi | H04L 41/0661 |
| 2024/0330533 | A1* | 10/2024 | Lincourt, Jr. | G06F 30/20 |
| 2025/0138515 | A1* | 5/2025 | Koh | G05B 19/4185 |
| 2025/0341825 | A1* | 11/2025 | Lee | G06F 30/10 |

OTHER PUBLICATIONS

Larsson R., "Creating Digital Twin Distributed Networks Using Switches With Programmable Data Plane", Linkoping University, Department of Computer and Information Science, Master's thesis, last updated on Apr. 28, 2021, 80 Pages.

Pulvino E., "Evolving from Network Simulation to Data Center Digital Twin", NVIDIA Developer, Oct. 3, 2022, 5 Pages.

* cited by examiner

*Primary Examiner* — Chat C Do
*Assistant Examiner* — Christopher J Salley
(74) *Attorney, Agent, or Firm* — Baker Botts L.L.P.

(57) ABSTRACT

In one embodiment, a method may receive a request to upgrade software for a switch. The method may use an application-specific integrated circuit (ASIC) simulator to generate a digital twin to store a first image and a first configuration of the switch. The method may use the digital twin to generate a second image and a second configuration by replaying the first configuration on the first image. The method may communicate the second image and the second configuration from the digital twin to an ASIC memory of an ASIC associated with the switch by applying batch direct memory access (DMA).

16 Claims, 5 Drawing Sheets

SYSTEMS AND METHODS FOR COLD BOOT USING DIGITAL TWIN

TECHNICAL FIELD

The present disclosure relates generally to the field of communications and, more particularly, to systems and methods for a cold boot assisted by a digital twin to upgrade software for switching and routing gear in data centers.

BACKGROUND

Devices, such as switches or routers, in the datacenters routinely go through software upgrades for new features and bug fixes. In particular, the devices may receive a separate software release that contains an enhanced configuration or feature set. The devices usually require a period of time to verify that the downloaded software image supports both hardware and software features on the devices. Thus, such upgrades typically require device reboots, resulting in data plane and control plane downtime. In-Service Software Upgrade (ISSU) is a nondisruptive upgrade process that upgrades an image to another image on the devices while the network continues to forward packets by running two different software versions at the same time. As a result, ND ISSU may help to avoid data plane downtime and upgrade the software version of the release on the devices. However, the ISSU process is difficult for implementation in the field because of software complexity in saving and restoring the state of software. In addition, ND ISSU is supported on limited form factors of the routers because of enormous software complexity. Therefore, it is desired to develop a reliable method to avoid software complexities and limitations for software upgrades on the devices.

A digital twin (DT) is a smart system that may use a virtual representation of elements and dynamics of a real physical system to replicate the performance of the real physical system. To improve the effectiveness of the digital twin, a machine learning model is typically designed to operate in conjunction with a physical model, artificial intelligence (AI) based communication, and a plurality of computing systems. For example, a digital twin may be a plan twin or a process twin. The digital twin may involve a multi-objective optimization algorithm and one or more three-dimensional (3D) models that act as a smart viewer and advanced simulation environment. As another example, the process twin may involve a digital representation of a process/automation system that is used for studying the behavior and performance of an asset. The digital twin usually includes several components: physical modeling, virtual simulation, verification, validation, and accreditation. For example, the physical model may extract a plurality of key features of a physical object, such as a switch. As another example, the virtual simulation may build a virtual representation for a mirror reflection of the physical model to emulate the same features and behaviors in a virtual space. As another example, verification, validation, and accreditation may validate the veracity of the virtual model and provide a confidence level by checking errors in the physical/virtual model.

DESCRIPTION OF EXAMPLE EMBODIMENTS

Overview

Figure 1:
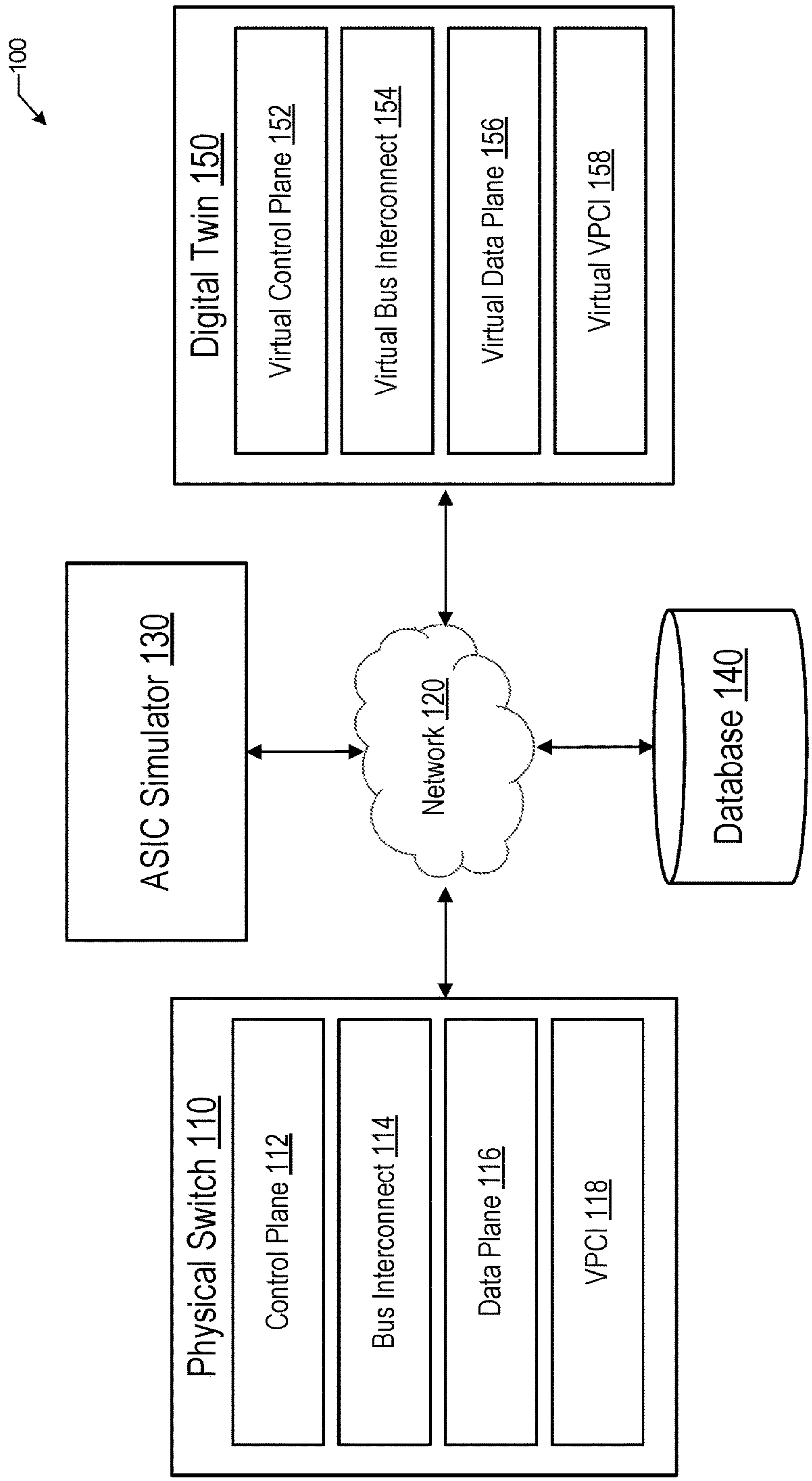
FIG. 1 illustrates an example cold boot control system for use in a product.

In one or more embodiments, an apparatus may include one or more processors and one or more computer-readable non-transitory storage media comprising instructions that, when executed by the one or more processors, cause one or more components of the apparatus to perform operations. The operations include receiving a request to upgrade software for a switch. The operations further include generating, using an application-specific integrated circuit (ASIC) simulator, a digital twin to store a first image and a first configuration of the switch. The operations further include generating, using the digital twin, a second image and a second configuration by replaying the first configuration on the first image. The operations further include communicating the second image and the second configuration from the digital twin to an ASIC memory of an ASIC associated with the switch by applying batch direct memory access (DMA). The first configuration is a binary configuration. The second image and the second configuration are stored in a virtual shadow memory of the digital twin.

In one or more embodiments, the operations further include issuing a command to reload the digital twin with the first image and the first configuration on the switch in response to receiving the request to update the software for the switch, the operations further include attempting to use the digital twin to identify an anomaly while replaying the first configuration on the first image. In response to identifying the anomaly, the operations further include determining that the second configuration is an American Standard Code for Information Interchange (ASCII) configuration and generating, using the digital twin, the second image by replaying the second configuration on the first image. In response to not identifying the anomaly, the operations further include determining that the second configuration is a binary configuration. The operations further include performing, using the digital twin, batch DMA to transfer the second image and the second configuration stored in the virtual shadow memory of the digital twin to the ASIC memory of the ASIC associated with the switch once replaying the first configuration is complete.

In one or more embodiments, the operations further include apply a workflow to receive the second image and the second configuration from the digital twin. The workflow includes resetting the ASIC memory and disconnect a software development kit (SDK) of the software for the switch from the ASIC to shut down a data plane and a control plane of the switch. The workflow includes reloading an ASIC microcode and perform batch DMA to transfer the virtual shadow memory received from the digital twin to the ASIC memory. The workflow includes loading a minimal utility (min_pkt) on an embedded central processing unit (CPU) of the ASIC memory. The embedded CPU may communicate one or more control packages to the digital twin. The operations further include replaying the second configuration to reload the switch with the second image. The operations further include connecting the control plane to the software on the switch. The apparatus is configured to connect the SDK of the software for the switch to the ASIC, the operations further include terminating the digital twin after reloading the switch with the second image.

In one or more embodiments, a computer-implemented method, by an apparatus, may receive a request to upgrade software for a switch. The computer-implemented method may use an application-specific integrated circuit (ASIC) simulator to generate a digital twin to store a first image and a first configuration of the switch. The computer-implemented method may use the digital twin to generate a second image and a second configuration by replaying the first configuration on the first image. The computer-implemented method may communicate the second image and the second configuration from the digital twin to an ASIC memory of an ASIC associated with the switch by applying batch DMA. The first configuration is a binary configuration. The second image and the second configuration are stored in a virtual shadow memory of the digital twin.

In one or more embodiments, the computer-implemented method may issue a command to reload the digital twin with the first image and the first configuration on the switch in response to receiving the request to update the software for the switch. The computer-implemented method may attempt to use the digital twin to identify an anomaly while replaying the first configuration on the first image. In response to identifying the anomaly, the computer-implemented method may determine that the second configuration is an ASCII configuration and use the digital twin to generate the second image by replaying the second configuration on the first image. In response to not identifying the anomaly, the computer-implemented method may determine that the second configuration is a binary configuration. The computer-implemented method may use the digital twin to perform batch DMA to transfer the second image and the second configuration stored in the virtual shadow memory of the digital twin to the ASIC memory of the ASIC associated with the switch once replaying the first configuration is complete.

In one or more embodiments, the computer-implemented method may apply a workflow to receive the second image and the second configuration from the digital twin. The workflow includes resetting the ASIC memory and disconnect an SDK of the software for the switch from the ASIC to shut down a data plane and a control plane of the switch. The workflow includes reloading an ASIC microcode and perform batch DMA to transfer the virtual shadow memory received from the digital twin to the ASIC memory. The workflow includes loading a minimal utility (min_pkt) on an embedded CPU of the ASIC memory. The embedded CPU may communicate one or more control packages to the digital twin. The method may replay the second configuration to reload the switch with the second image. The computer-implemented method may connect the control plane to the software on the switch. The computer-implemented method may connect the SDK of the software for the switch to the ASIC. The computer-implemented method may terminate the digital twin after reloading the switch with the second image.

In one or more embodiments, a non-transitory computer-readable medium may include instructions that are configured, when executed by a processor, to receive a request to upgrade software for a switch. The instructions, when executed by a processor, are configured to use an ASIC simulator to generate a digital twin to store a first image and a first configuration of the switch. The instructions, when executed by a processor, are configured to use the digital twin to generate a second image and a second configuration by replaying the first configuration on the first image. The instructions, when executed by a processor, are configured to communicate the second image and the second configuration from the digital twin to an ASIC memory of an ASIC associated with the switch by applying batch DMA.

Technical advantages of certain embodiments of this disclosure may include one or more of the following. Certain apparatuses and methods described herein may use a cold boot approach assisted by a digital twin to update software for a switch. In certain embodiments, the cold boot approach shrinks the control plane and/or data plane downtime. In some embodiments, the cold boot approach allows for kernel upgrades. The apparatus and the method may perform batch DMA to transfer a virtual shadow memory received from the digital twin to the ASIC memory to make an upgrade process more efficient and reliable compared to conventional methods. For example, the cold boot approach may generate negligible data plane and control plane downtime, which may make networks more efficient and available with programmable ASICS.

Other technical advantages will be readily apparent to one skilled in the art from the following figures, descriptions, and claims. Moreover, while specific advantages have been enumerated above, various embodiments may include all, some, or none of the enumerated advantages.

Example Embodiments

In-service software upgrade (ISSU) is a process that upgrades an image to another image on a device, such as a switch or a router, while the network continues to forward packets. ISSU is implemented in an install mode to avoid a network outage when performing a software upgrade on the device. For example, a container-based ISSU allows a new image to come up in a new container while the existing image continues to run in its own container. Thus, the container-based ISSU reduces the control plane downtime, but has the limitation that the system does not upgrade the kernel itself. In some embodiments, the container-based ISSU also adds software complexity. Due to the ISSU complexities and limitations, many software upgrade systems implement an alternative of ISSU called fast boot or express boot which is typically a fine-tuned cold boot sequence that reduces the data plane and control plane downtime. Compared to a warm boot, a cold boot is configured to start up a system from a cold state where the system is in a completely powered-off state. Thus, the cold boot may involve booting up the operating system and initializing the hardware components.

In some embodiments, traditional software upgrade systems usually provide fast boot with a data plane downtime of 2-25 seconds(s) and a control plane downtime of 2-100 s. In some embodiments, traditional software upgrade systems implement a mechanism to upgrade software for a physical switch in four steps: 1) issue a reload command and save a current configuration of the physical switch with a first image; 2) reload the switch either with Linux 'kexec' or complete kernel restart while a data plane is left untouched until step 4 and the control plane goes down; 3) replay the configuration to rebuild multiple states in different operating systems of the physical switch and send the replay of the configuration to ASIC drivers to be saved in shadow memory as a second image; and 4) reset the ASICs once the ASIC configuration replay is complete and DMA the shadow memory to the hardware of the physical switch while the data plane is down. Thus, the control plane and the data plane are uploaded with the second image. As a result, the last three steps of the mechanism take a significant amount of time and keep the control plane down for that duration. In some embodiments, the software upgrade may suffer from software bugs that cause the second image to not replay the configuration that is saved by the first image in the first step. The software bugs may force the software upgrade to go via the ASCII replay of the configuration, which is much slower than the preferred binary replay of the configuration. Additionally, an upgrade scenario like an upgrade from a 32-bit image to a 64-bit image or vice versa also requires slow ASCII replay of the configuration, which is saved by the first image in the first step. Therefore, it is desirable to develop a reliable and efficient cold boot control system for a data plane with programmable ASICs to allow software upgrades in a non-disruptive reloading process with reduced control plane and data plane downtime.

In some embodiments, the cold boot control system may implement a digital twin to shrink the control plane and data plane downtime and allow kernel upgrade. In particular, the bold boot method may implement batch DMA and shadow memory to significantly reduce the ASIC configuration time. For example, the cold boot control system may use an ASIC simulator to generate a digital twin for the physical switch in the cloud. The digital twin may use a plurality of components to accurately simulate a plurality of operating system processes running a first image associated with the physical switch. In particular, the digital twin may run the same image and configuration that are running on the physical switch. In certain embodiments, the cold boot control system upgrades the digital twin from the first image to a second based on a predetermined mechanism for a software upgrade for the physical switch. For example, the predetermined mechanism may be a mechanism for traditional software upgrade systems. In some embodiments, during the ASIC configuration replay, the cold boot control system may store the writes to the ASICs in a shadow memory, which is a replica of the ASIC memory both in terms of the content and the layout. Once the digital twin successfully finishes the upgrade its running binary configuration is collected and sent to the physical switch. Likewise, the digital twin may also send the resultant shadow memory of the ASIC to the physical switch. As a result, the cold boot control system may provide a robust and efficient cold root to upgrade software for the physical switch with a control plane and data plane downtime of about 100 milliseconds (ms).

FIG. 1 illustrates an example cold boot control system 100 for use in a product. In an embodiment, cold boot control system 100 may include physical switch 110, network 120, ASIC simulator 130, database 140, and digital twin 150. Physical switch 110 may be communicatively coupled to ASIC simulator 130 to generate digital twin 150 associated with physical switch 110. Digital twin 150 may simulate a plurality of operating system processes on the physical switch and a virtual shadow memory which is a replica of a corresponding ASIC memory associated with the physical switch. Likewise, physical switch 110 may be communicatively coupled to digital twin 150 to communicate data associated with the software upgrade between physical switch 110 and digital twin 150. In particular, the data associated with the software upgrade may include an image, a configuration, and/or a minimal utility (min_pkt). Physical switch 110 may be communicatively coupled to digital twin 150 to receive low-level computer instruction, such as an ASIC microcode, for programmable ASICs. Thus, an ASIC of the physical switch may execute the ASIC microcode on a processor to translate machine instructions, state machine data, or other input into sequences of detailed circuit level operations. For example, the ASIC microcode may include one or more microcode routines used to encode and decode data packets received by the ASIC.

In an embodiment, physical switch 110 may be communicatively coupled to network 120 to use ASIC simulator 130 and digital twin 150 to simulate the plurality of operating system processes associated with physical switch 110. Network 120 broadly represents any wireline or wireless network, using any of satellite or terrestrial network links, such as public or private cloud on the Internet, local area networks (LANs), metropolitan area networks (MANs), wide area networks (WANs), a public switched telephone network (PSTN), campus network, internetworks, or combinations thereof. The network 120 may include or comprise the public internet and networked server computers that implement Web2 and/or Web3 technologies. Network 120 may comprise or support intranets, extranets, or virtual private networks (VPNs). Network 120 may also comprise a public switched telephone network (PSTN) using digital switches and call forwarding gear. Network 120 may also comprise a public switched telephone network (PSTN) using digital switches and call forwarding gear.

In an embodiment, physical switch 110 may be configured with a control plane 112, a bus interconnect 114, a data plane 116, and a virtual PCI (VPCI) 118. Control plane 112 is configured to operate with data plane 116 to control how data packets are forwarded. For example, control plane 112 may use Secure Shell (SSH) to login into a router. As another example, control plane 112 may create, populate, and update a plurality of routing or forwarding tables using one or more protocols, such as Border Gateway Protocol (BGP), Open Shortest Path First (OSPF), Enhanced Interior Gateway Routing Protocol (EIGRP), and Intermediate System to Intermediate System (IS-IS), etc. Control plane hardware components are optimized for customizability, handling policies, and exceptions, and are often implemented via microprocessor(s) that implement instructions stored in local memory. Data plane 116 is also called a forwarding plane which uses ASICs to forward the data packets by providing a high speed and low latency path. For example, data plane 116 may pass SSH traffic through to another device. As another example, data plane 116 may forward BGP traffic. In particular, data plane 116 may access bus interconnect 114 through bus drivers to connect to a host processor 202 (referring to FIG. 2), such as a host central processing unit (CPU), of control plane 112, when a control plane-associated packet is received, it is directed through data plane 116 to the bus interconnect 114 to the host CPU of control plane 112. The host CPU may then determine any updates to the plurality of routing or forwarding tables associated with data plane 116 and write those updates to bus interconnect 114, which are updated by data plane 116. Physical switch 110 may use VPCI 118 as a control plane data plane interface transport module to transmit one or more bus transactions in a message via network 120 to a corresponding VPCI 158 of digital twin 150. Thus, physical switch 110 may use various protocols to identify network paths and store these paths in routing or forwarding tables to communicate the data packets from/to digital twin 150.

In an embodiment, physical switch 110 may be configured to receive a request to upgrade software. Physical switch 110 may use ASIC simulator 130 to generate digital twin 150 which includes a virtual control plane 152, a virtual bus interconnect 154, a virtual data plane 156, and a virtual VPCI 158. In particular, digital twin 150 is configured to use ASIC simulator 130 in place of a real ASIC and run a first image and a first configuration which are a same image 232 (referring to FIG. 2) and a same configuration 234 (referring to FIG. 2) that are running on physical switch 110. For example, images 232 may include an operating system and a plurality of routing applications associated with physical switch 110. As another example, configuration 234 may include a binary configuration file and an ASCII configuration file which contain the system configurations which fast reload uses on upgrade or fast reload. Digital twin 150 may store the first image and the first configuration in a virtual ASIC memory associated with digital twin 150. Virtual control plane 152 is configured to operate with virtual data plane 156 to control how data packets are forwarded. For example, virtual control plane 152 may use SSH to login into a router. As another example, virtual control plane 152 may create, populate, and update a plurality of routing or forwarding tables using one or more protocols, such as BGP, OSPF, EIGRP, and IS-IS, etc. Virtual control plane hardware components are optimized for customizability, handling policies, and exceptions, and are often implemented via microprocessor(s) that implement instructions stored in local memory. Virtual data plane 156 may use virtual ASICs to forward the data packets by providing a high-speed and low-latency path. For example, virtual data plane 156 may pass SSH traffic through to another device. As another example, virtual data plane 156 may forward BGP traffic. In particular, virtual data plane 156 may access virtual bus interconnect 154 through virtual bus drivers to connect to a virtual host CPU of virtual control plane 152, when a control plane-associated packet is received, it is directed through virtual data plane 156 to virtual bus interconnect 154 to the virtual host CPU of virtual control plane 152. The virtual host CPU may then determine any updates to the plurality of routing or forwarding tables associated with virtual data plane 156 and write those updates to virtual bus interconnect 154, which are updated by virtual data plane 156. Digital twin 150 may use virtual VPCI 158 as a control plane data plane interface transport module to transmit one or more bus transactions in a message via network 120 to a corresponding VPCI 118 of physical switch 110. Thus, digital twin 150 may use various protocols to identify network paths and store these paths in routing or forwarding tables to communicate the data packets from/to physical switch 110.

In some embodiments, cold boot control system 100 may be configured to turn down control plane 112 during a software upgrade operation, particularly for non-redundant switches. Thus, cold boot control system 100 may update an operating system or application executing in that operating space. However, data plane 116 may be left running, without control plane 112. In particular, the routing and forwarding information in data plane 116 and protocol state machine changes in control plane 112 can become stale or lost. Redundant equipment, which has its own independent set of data-plane and control-plane components, is often used in switchover operations to completely take over the role of the upgrading device.

In some embodiments, digital twin 150 may be configured to upgrade with a second image by implementing a predetermined mechanism. For example, the predetermined mechanism may be applied to upgrade software for a physical switch in one or more of the following steps: 1) issue a reload command and save a current configuration of digital twin 150 with the first image; 2) reload digital twin 150 either with Linux 'kexec' or complete kernel restart while virtual data plane 156 is left untouched until step 4 and virtual control plane 152 goes down; 3) replay the configuration to rebuild multiple states in different operating systems of digital twin 150 and send the replay of the configuration to virtual ASIC drivers to be saved in a virtual shadow memory as the second image; and/or 4) reset the virtual ASICs once the ASIC configuration replay is complete and DMA the virtual shadow memory to the virtual hardware of digital twin 150 while virtual data plane 156 is down. Thus, virtual control plane 152 and virtual data plane 156 are uploaded with the second image.

Figure 2:
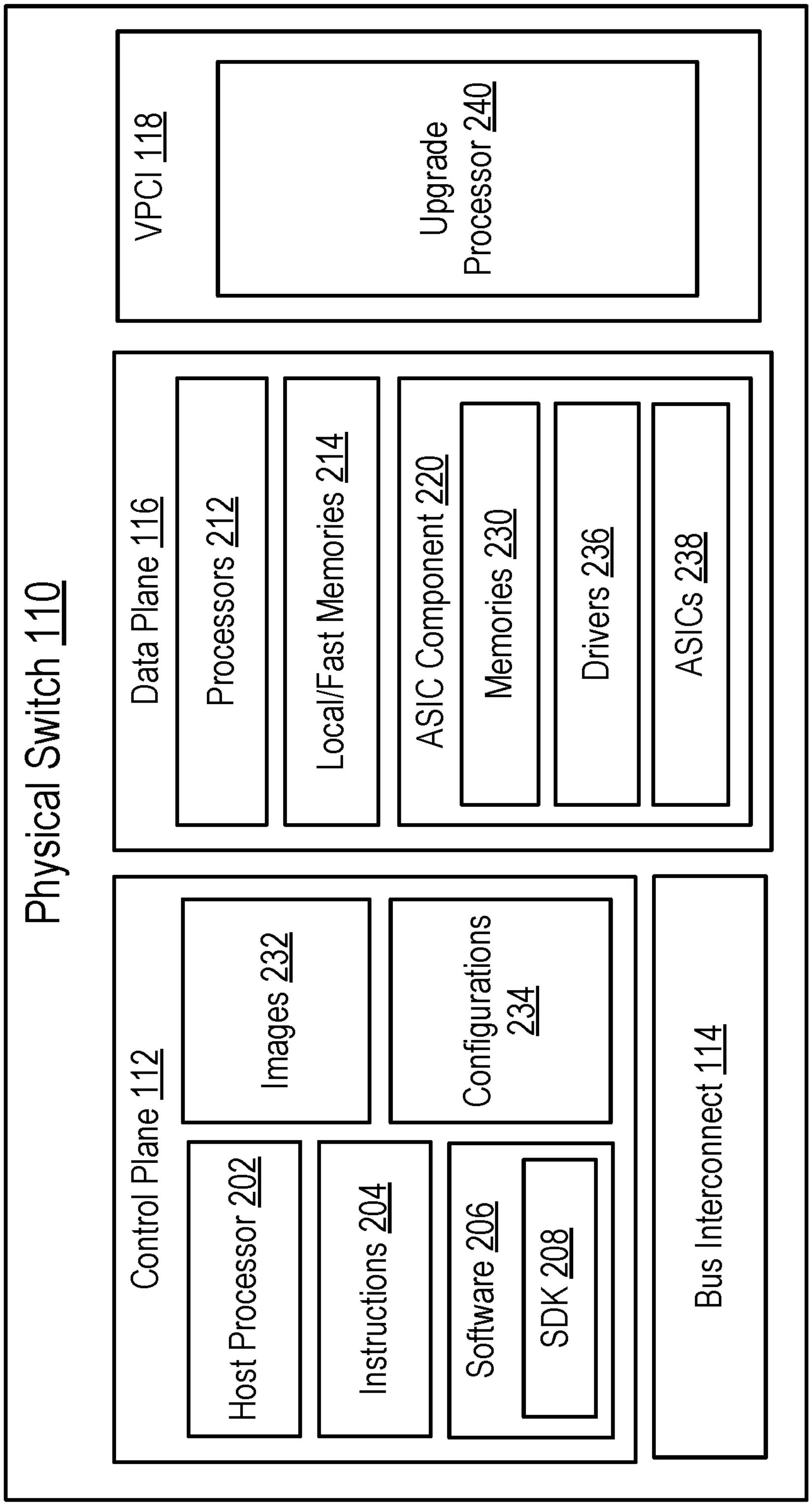
FIG. 2 illustrates an example physical switch.

In some embodiment, upon transition to the second image on digital twin 150, physical switch 110 may implement a plurality of operating system processes to replay the binary configuration to rebuild multiple states in different operating systems of physical switch 110 and send the replay of the binary configuration to ASIC drivers of physical switch 110 to be saved in a shadow memory as the second image, such as images 232 (referring to FIG. 2). In particular, during the replay of the binary configuration, data plane 116 may store the writes to ASICs 238 (referring to FIG. 2) in a shadow memory that is replica of the ASIC memory both in terms of the content and the layout. Thus, any software bug related to replaying the saved configuration may be known at this point. Therefore digital twin 150 may be implemented to detect an unexpected failure during software upgrade on physical switch 110. For example, the cold boot control system 100 may be configured to upgrade digital twin 150 using an ASCII replay of the binary configuration instead of a binary replay of the binary configuration when a failure is determined during a binary configuration restore of digital twin 150. As another example, the cold boot control system 100 may be configured to skip the upgrade step on digital twin 150 and generate digital twin 150 directly based on the second image to upgrade physical switch 110. Additionally, physical switch 110 does not store its configuration because physical switch 110 may receive a binary configuration from digital twin 150 after the second image is generated by digital twin 150. Likewise, physical switch 110 may perform configuration sync with digital twin 150 after physical switch 110 is reloaded with the second image.

In some embodiments, physical switch 110 may configured to disconnect SDK 208 (referring to FIG. 2) from ASICs 238 (referring to FIG. 2) to prevent from programming of ASICs 238 (referring to FIG. 2) as part of the replay of the binary configuration before data plane 116 of physical switch 110 is upgraded with the second image. Physical switch 110 may reload an ASIC microcode for programmable ASICs 238 (referring to FIG. 2), reset ASICs 238 (referring to FIG. 2), and DMA the virtual shadow memory from digital twin 150 to ASICs 238 (referring to FIG. 2) to upgrade data plane 116 of physical switch 110. In particular, physical switch 110 may load a minimal packet utility (min_pkt) on an embedded CPU of ASICs 238 (referring to FIG. 2) to relay control traffic to/from digital twin 150. For example, the control packet sent back from digital twin 150 is received by min_pkt and transmitted out of ASIC 238 (referring to FIG. 2) of physical switch 110 as per one or more internal headers, such as iETH or NPU header, of the traffic packet.

In some embodiment, both ASICs 238 (referring to FIG. 2) of physical switch 110 and digital twin 150 may run the same image effectively. For example, ASICs 238 (referring to FIG. 2) of physical switch 110 may run data plane 116 on the second image, and digital twin 150 may run virtual control plane 152 on the second image. The min_pkt utility is also capable of servicing the data plane modification requests, if any, from virtual control plane 152 of digital twin 150. The transport between min_pkt and digital twin 150 may be any appropriate existing tunnels technology, such as an Encapsulated remote Switch port Analyzer (ERSPAN) tunnel, an Internet Protocol (IP) in IP tunnel, etc.

In some embodiments, physical switch 110 is upgraded with the second image after the replay of the binary configuration is finished. Control plane 112 may be connected to switch software 206 (referring to FIG. 2). The min-pkt utility min_pkt is disabled by tearing down a control path from physical switch 110 to digital twin 150 and terminating digital twin 150. SDK 208 (referring to FIG. 2) may be connected back to ASICs (referring to FIG. 2) to allow new programming using the second image. Likewise, physical switch 110 may uses the binary configuration sent by digital twin 150 or perform a configuration sync with digital twin 150. While the operating system processes of physical switch 110 replay the binary configuration, ASICs 238 (referring to FIG. 2) are left untouched running with data plane 116 using the second image. Therefore, cold boot control system 100 may implement digital twin 150 to efficiently upgrade physical switch 110 by performing a dry run of the upgrade of physical switch 110. The binary configuration corresponding to the second image of physical switch 110 may be used to remove the complexity and time of local save and store on physical switch 110. In some embodiments, physical switch 110 may service the control traffic when physical switch 110 undergoes the reload of the binary configuration. In addition, programmable ASICs 238 (referring to FIG. 2) may undergo data plane changes with underlying Node Programming Language (NPL) code and forwarding databases which require ASIC reset during the upgrade. As a result, cold boot control system 100 may provide a robust and efficient cold root to upgrade software for physical switch 110, such as a Programming Protocol-independent Packet Processors (P4) programmable switch or a National Physical Laboratory (NPL) programmable switch, with a control plane and data plane downtime of about 100 ms.

Although FIG. 1 illustrates a particular number of physical switch 110, control plane 112, bus interconnect 114, data plane 116, VPCI 118, network 120, ASIC simulator 130, database 140, digital twin 150, virtual control plane 152, virtual bus interconnect 154, virtual data plane 156, and virtual VPCI 158, this disclosure contemplates any suitable number of physical switch 110, control plane 112, bus interconnect 114, data plane 116, VPCI 118, network 120, ASIC simulator 130, database 140, digital twin 150, virtual control plane 152, virtual bus interconnect 154, virtual data plane 156, and virtual VPCI 158. For example, physical switch 110 may perform one or more actions of ASIC simulators 130.

Although FIG. 1 illustrates a particular arrangement of physical switch 110, control plane 112, bus interconnect 114, data plane 116, VPCI 118, network 120, ASIC simulator 130, database 140, digital twin 150, virtual control plane 152, virtual bus interconnect 154, virtual data plane 156, and virtual VPCI 158, this disclosure contemplates any suitable arrangement of physical switch 110, control plane 112, bus interconnect 114, data plane 116, VPCI 118, network 120, ASIC simulator 130, database 140, digital twin 150, virtual control plane 152, virtual bus interconnect 154, virtual data plane 156, and virtual VPCI 158.

Although FIG. 1 describes and illustrates particular components, devices, or systems carrying out particular actions, this disclosure contemplates any suitable combination of any suitable components, devices, or systems carrying out any suitable actions. For example, physical switch 110 may perform one or more actions of ASIC simulators 130.

FIG. 2 illustrates an example physical switch 110. Physical switch 110 may be configured to provide sufficient operating systems and application response to perform a cold boot assistant by digital twin 150 (referring to FIG. 1) to upgrade software for physical switch 110. In some embodiments, control plane 112 may include a host processor 202 which is configured to run on a kernel/system image and a configuration, such as images 232 and configurations 234, to execute instructions 204 associated with applications and middleware within the framework of an operating system associated with physical switch 110. In particular, host processor 202 may include a core of a microprocessor or microcontroller having Reduced Instruction Set Computer (RISC) or Complex Instruction Set Computers (CISC) architecture. For example, the RISC architecture utilizes a single-clock small, highly-optimized instruction. As another example, the CISC architecture utilized a multi-clock complex instruction. In some embodiments, the framework of the operating system may include software 206 for a software application, firmware, middleware, preconfigured logic function of configurable hardware (IP), or a combination thereof. Software 206 may include SDK 208, which is a set of platform-specific building tools, such as debuggers, compilers, and libraries to create code that runs on a specific platform, operating system, or programming language. As a result, during a fast reboot/reload, the kernel/system image, such as images 232, that runs on host processor 202 may load a same image as previously running. Likewise, in a fast upgrade, the kernel/system image, such as images 232, that runs on host processor 202 loads a different image as previously running.

In some embodiments, host processor 202 may be configured to communicate with a forwarding processor, such as processors 212, of data plane 116. In particular, host processor 202 interfaces with bus interconnect 114, which serves as a data plane interface to processors 212 and/or other components of the data plane 116.

In some embodiments, data plane 116 may include a plurality of hardware and software components, such as one or more processes 212, one or more local/fast memories 214, and an ASIC component 220, responsible for the routing of packets from one port of physical switch 110 to another port and are optimized for speed, simplicity, and regularity. Data plane 116 may rely on one or more routing and/or forwarding tables that are maintained in high-speed, often customized, memory or tables. In particular, data plane 116 includes one or more processors 212 that interface with ASIC component 220 and high-speed memory across dedicated data buses or switch fabrics. In some embodiments, physical switch 110 may include a plurality of ports coupled to one or more forwarding engines implemented in the one or more processors 212, such as route or network processors, of data plane 116 via a bus structure. In particular, the one or more processors 212 may be used to execute routing protocols by maintaining routing information and forwarding table(s). In some embodiments, the one or more processors 212 may have access to one or more local/fast memories 214, such as ternary content-addressable memory (TCAM), content-addressable memory (CAM), static random-access memory (SRAM), buffers, dynamic random-access memory (DRAM), etc. In some embodiments, ASIC component 220 may include a plurality of forwarding engines comprising one or more memory and memory-like resources 230 (e.g., CAM, registers, buffers), driver 236, and ASICs 238. For example, data plane 116 may receive a data package from a port associated with a forwarding engine. The frame is driven over an internal bus of the forwarding engine based on a forwarding decision rendered by ASICs 238 (or local processor) or is driven over a bus structure to other ports in physical switch 110 based on the forwarding decision rendered by the forwarding engine.

In some embodiments, VPCI 118 may be configured to serve as a logical data plane interface which provides an update to the upgrade processor 240. Upgrade processor 240 may include a core of a microprocessor or microcontroller having RISC or CISC architecture which is implemented in a microprocessor, field-programmable gate arrays (FPGA), ASIC/digital signal processing (DSP), or other like instruction processing device. In particular, upgrade processor 240 may be a lightweight processor suitably sized to perform encapsulation and decapsulation operations or data packet by executing low-level computer instructions, such as microcode, within the framework of the operating system. For example, upgrade processor 240 may write the update to an addressed data plane resource in data plane 116, such as Media Access Control (MAC) address tables, forwarding information base (FIB) tables, Access Control List (ACL) tables, and any other tables, register contents, CAM contents, TCAM contents, binary content-addressable memory (BCAM) contents, and memory contents (e.g., non-persistent, volatile, etc.) maintained or used by data plane processors 212. Thus, VPCI 118 may work on address/value tuples or table/index/value tuples in a transaction in a data plane upgrade message from a corresponding bus interconnect of a network device, such as digital twin 150 (referring to FIG. 1).

Although FIG. 2 illustrates a particular number of control planes 112, host processors 202, instructions 204, software 206, SDKs 208, images 232, configurations 234, bus interconnects 114, data planes 116, processors 212, local/fast memories 214, ASIC components 220, memories 230, drivers 236, ASICs 238, VPCIs 118, and upgrade processors 240, this disclosure contemplates any suitable number of control planes 112, host processors 202, instructions 204, software 206, SDKs 208, images 232, configurations 234, bus interconnects 114, data planes 116, processors 212, local/fast memories 214, ASIC components 220, memories 230, drivers 236, ASICs 238, VPCIs 118, and upgrade processors 240. For example, VPCI 118 may include more than one upgrade processor 240.

Although FIG. 2 illustrates a particular arrangement of control plane 112, host processor 202, instructions 204, software 206, SDK 208, images 232, configurations 234, bus interconnect 114, data plane 116, processors 212, local/fast memories 214, ASIC component 220, memories 230, drivers 236, ASICs 238, VPCI 118, and upgrade processor 240, this disclosure contemplates any suitable arrangement of control plane 112, host processor 202, instructions 204, software 206, SDK 208, images 232, configurations 234, bus interconnect 114, data plane 116, processors 212, local/fast memories 214, ASIC component 220, memories 230, drivers 236, ASICs 238, VPCI 118, and upgrade processor 240.

Although FIG. 2 describes and illustrates particular components, devices, or systems carrying out particular actions, this disclosure contemplates any suitable combination of any suitable components, devices, or systems carrying out any suitable actions. For example, physical switch 110 may perform one or more actions of ASIC component 220.

Figure 3:
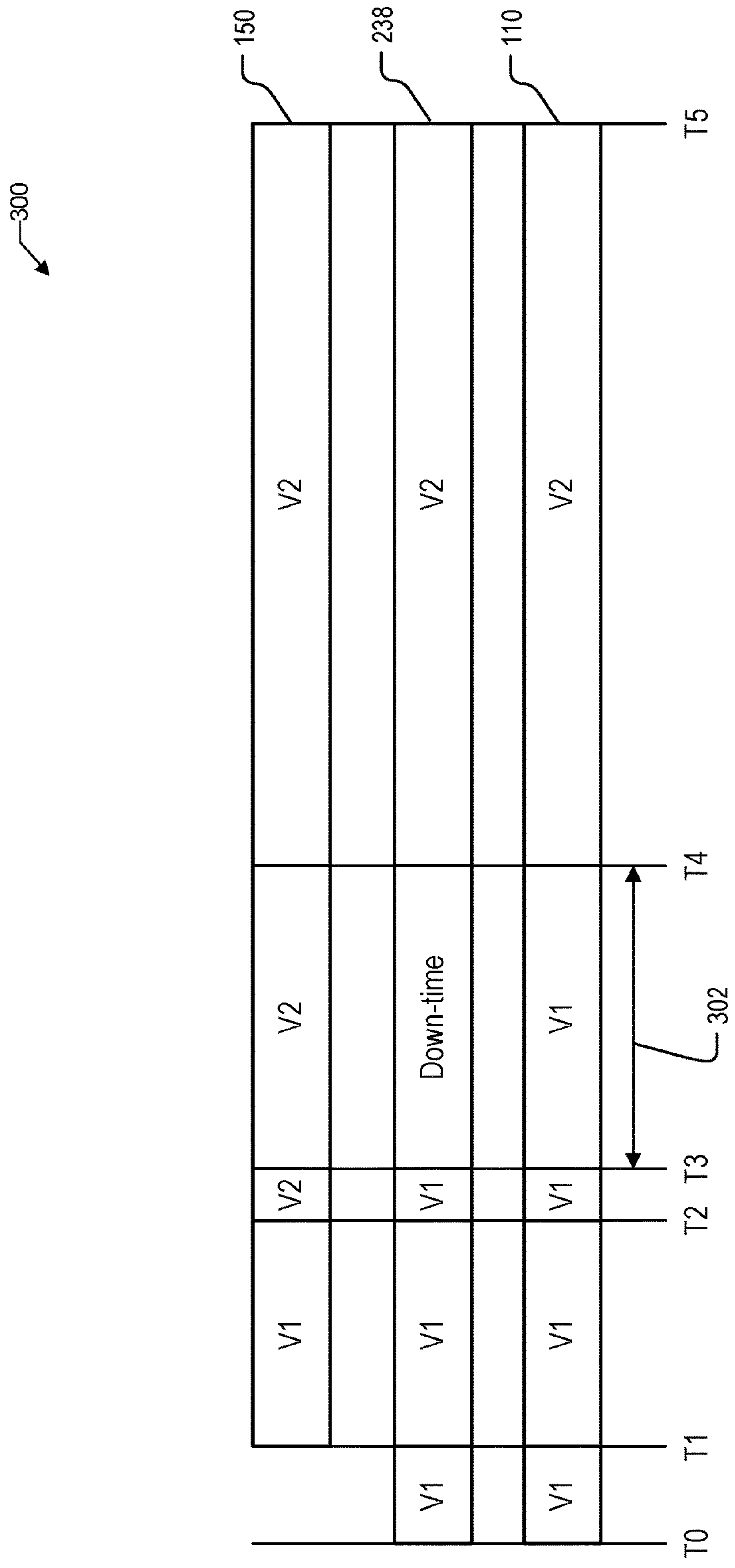
FIG. 3 illustrates an example software upgrade for a physical switch using a digital twin.

FIG. 3 illustrates an example software upgrade 300 for a physical switch (e.g., physical switch 110 of FIG. 2) using a digital twin (e.g., digital twin 150 of FIG. 1). The physical switch may receive a request to upgrade software when the physical switch is running on a first image, such as Version 1 of an image V1. Thus, at time T0, a control plane (e.g., control plane 112 of FIG. 1) of the physical switch may perform a process to issue a reload command by communicating to a data plane (e.g., data plane 116 of FIG. 1) of the physical switch. In response to the issued reload, the physical switch may generate the digital twin at time T2. The digital twin may use an ASIC simulator (e.g., ASIC simulator 130 of FIG. 1) in place of an ASIC (e.g., ASICs 238) of the physical switch and runs the same image and binary configuration that is running on the physical switch. At time T2, the digital twin is upgraded with a second image, such as Version 2 of the image V2, stored in a virtual ASIC shadow memory by implementing a predetermined mechanism to upgrade software on the digital twin. Thus, the digital twin may send the binary configuration and virtual ASIC shallow memory to the physical switch. At time T3, in response to receiving the second image from the digital twin, the physical switch may disconnect an SDK (e.g., SDK 208 of FIG. 2) from the ASIC to prevent ASIC programming as part of configuration replay. In some embodiments, the digital twin may perform batch DMA to transfer the second image from the virtual shadow memory from the digital twin to the ASIC. In addition, a minimal utility min_pkt is loaded on an embedded CPU of the ASIC to replay control packets from/to the digital twin. The control plane and data plane have a downtime 302 of about 100 ms before the ASIC is loaded with the second image. At time T4, the ASIC is fully loaded with the second image and the binary configuration from the digital twin. Thus, the digital twin may take over control plane duties and service all control plate traffic on the physical switch for reloading with the second image. In particular, the binary configuration may be replayed on the physical switch to upgrade the physical switch with the second image. At time T5, the replay of the binary configuration is complete on the physical switch. The control plane is connected to the SDK of the physical switch. Thus, the SDK is connected back to the ASICs to allow any new programming using the second image. In some embodiments, the digital twin is terminated and the minimal utility min_pkt is disabled after the replay of the configuration is finished.

Figure 4:
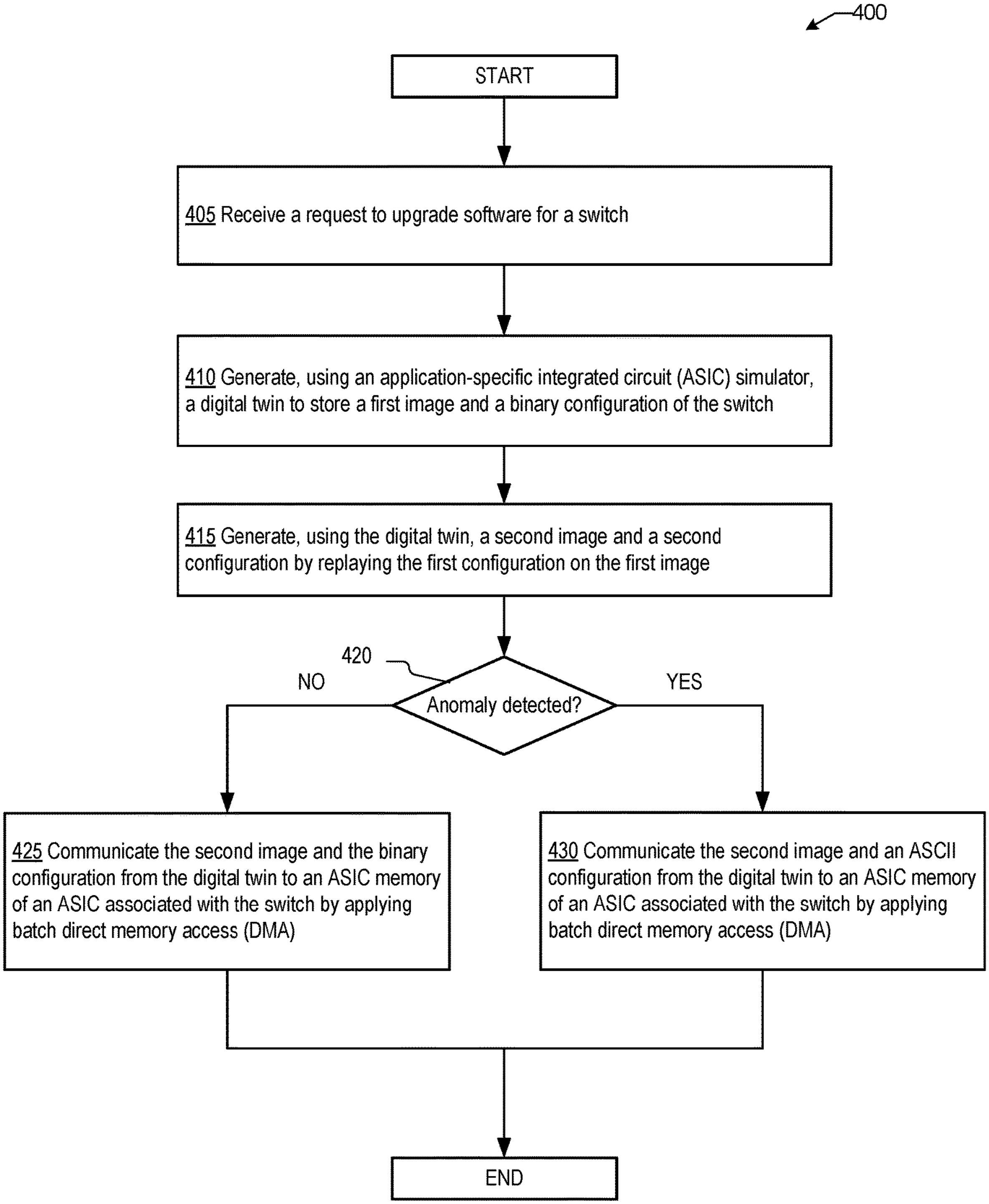
FIG. 4 illustrates an example method for upgrading software for a physical switch using a digital twin.

FIG. 4 illustrates an example method for upgrading software for a physical switch using a digital twin. Method 400 of FIG. 4 may be used by system 100 of FIG. 1. Method 400 starts at step 405, where cold boot control system 100 (referring to FIG. 1) may receive a request to upgrade software for a physical switch. For example, the physical switch may be a P4 or NPL programmable switch which is running on a first image and a first configuration. The first configuration is a binary configuration.

At step 410, cold boot control system 100 (referring to FIG. 1) may use an ASIC simulator to generate a digital twin to store the first image and the binary configuration of the physical switch. The digital twin may simulate the plurality of operating system processes associated with the physical switch. In particular, in response to receiving the request to update the software for the switch, cold boot control system 100 (referring to FIG. 1) may issue a command to reload the digital twin with the first image and the first configuration on the switch.

At step 415, cold boot control system 100 (referring to FIG. 1) may use the digital twin to generate a second image and a second configuration by replaying the first configuration on the first image. In particular, the digital twin may be upgraded with the second image using a predetermined mechanism based on the first image and the first configuration.

At step 420, cold boot control system 100 (referring to FIG. 1) may make a determination whether an anomaly is detected during an upgrade of the digital twin by replaying the binary configuration on the first image. In particular, in response to identifying the anomaly, the digital twin may determine that the second configuration is an ASCII configuration and generate the second image by replaying the ASCII configuration on the first image. In response to not identifying the anomaly, the digital twin may determine that the second configuration is a binary configuration. Where no anomaly is detected during the upgrade of the digital twin, the process may proceed to step 425. Where an anomaly is detected during the upgrade of the digital twin, the process may proceed to step 430.

At step 425, cold boot control system 100 (referring to FIG. 1) may communicate the second image and the binary configuration from the digital twin to an ASIC memory of an ASIC associated with the switch by applying batch DMA. In particular, the digital twin may perform batch DMA to transfer the second image and the binary configuration stored in the virtual shadow memory of the digital twin to the ASIC memory of the ASIC associated with the physical switch once replaying the binary configuration is complete.

In some embodiments, cold boot control system 100 (referring to FIG. 1) may apply one or more operations to receive the second image and the binary configuration from the digital twin to the physical switch. The one or more operations include: 1) resetting the ASIC memory and disconnecting an SDK of the software for the physics switch from the ASIC to shut down a data plane and a control plane of the switch; 2) reloading an ASIC microcode and performing batch DMA to transfer the virtual shadow memory received from the digital twin to the ASIC memory; 3) loading a minimal utility (min_pkt) on an embedded CPU of the ASIC memory which communicates one or more control packages to the digital twin; 4) replaying the binary configuration to reload the switch with the second image; 5) connecting the control plane to the software on the switch; 6) connecting the SDK of the software for the switch to the ASIC; and 7) terminating the digital twin after reloading the switch with the second image.

At step 430, cold boot control system 100 (referring to FIG. 1) may communicate the second image and the ASCII configuration from the digital twin to an ASIC memory of an ASIC associated with the switch by applying batch DMA. In particular, the digital twin may perform batch DMA to transfer the second image and the ASCII configuration stored in the virtual shadow memory of the digital twin to the ASIC memory of the ASIC associated with the physical switch once replaying the ASCII configuration is complete.

In some embodiments, cold boot control system 100 (referring to FIG. 1) may apply one or more operations to receive the second image and the ASCII configuration from the digital twin to the physical switch. The one or more operations include: 1) resetting the ASIC memory and disconnecting an SDK of the software for the physics switch from the ASIC to shut down a data plane and a control plane of the switch; 2) reloading an ASIC microcode and performing batch DMA to transfer the virtual shadow memory received from the digital twin to the ASIC memory; 3) loading a minimal utility (min_pkt) on an embedded CPU of the ASIC memory which communicates one or more control packages to the digital twin; 4) replaying the ASCII configuration to reload the switch with the second image; 5) connecting the control plane to the software on the switch; 6) connecting the SDK of the software for the switch to the ASIC; and 7) terminating the digital twin after reloading the switch with the second image.

Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. Moreover, although this disclosure describes and illustrates an example method to upgrade a physical switch using a digital twin, including the particular steps of the method of FIG. 4, this disclosure contemplates any suitable method including any suitable steps, which may include all, some, or none of the steps of the method of FIG. 4, where appropriate. In some embodiments, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Figure 5:
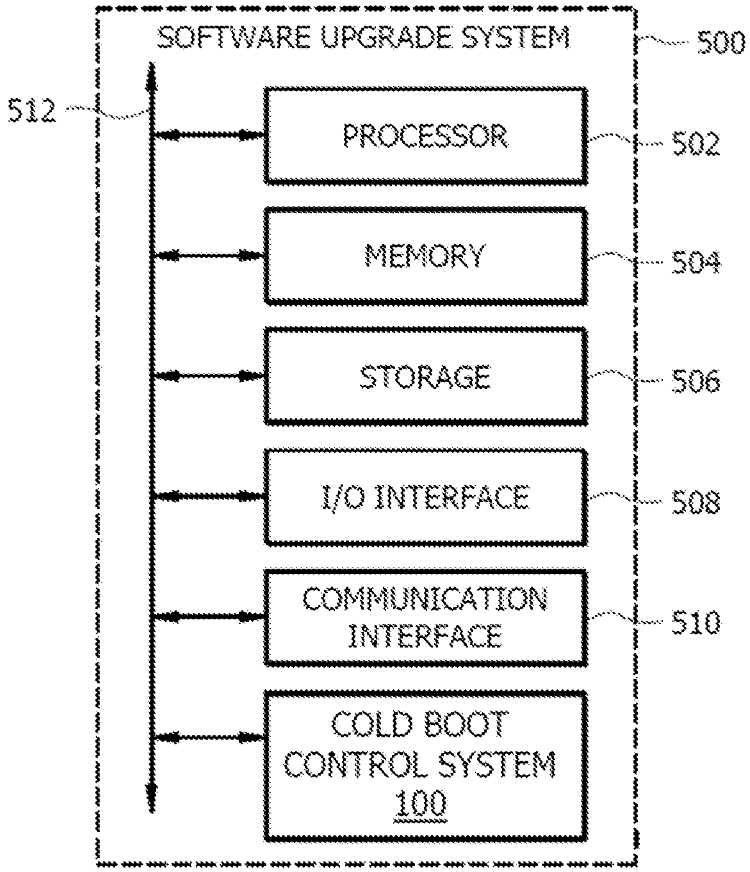
FIG. 5 illustrates an example software upgrade control system.

FIG. 5 illustrates an example software upgrade system 500. In particular embodiments, one or more software upgrade systems 500 perform one or more steps of one or more methods described or illustrated herein. In particular embodiments, one or more software upgrade systems 500 provide the functionality described or illustrated herein. In particular embodiments, software running on one or more software upgrade systems 500 performs one or more steps of one or more methods described or illustrated herein or provides functionality described or illustrated herein. Particular embodiments include one or more portions of one or more software upgrade systems 500. Herein, reference to an information handling system may encompass a computer or a computing device, and vice versa, where appropriate. Moreover, reference to an information handling system may encompass one or more computer systems, where appropriate. Further, the cold boot control system 100 in FIG. 1 may be incorporated into the illustrated software upgrade system 500. With reference to the present disclosure, software upgrade system 500 may be the aforementioned product incorporating cold boot control system 100, as described above with respect to FIG. 1. As such, "product" and "software upgrade system 500" may herein be used interchangeably.

This disclosure contemplates any suitable number of software upgrade systems 500. This disclosure contemplates software upgrade system 500 taking any suitable physical form. As example and not by way of limitation, software upgrade system 500 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, software upgrade system 500 may include one or more software upgrade systems 500; be unitary or distributed; span multiple locations; span multiple machines; span multiple data centers; or reside in a cloud, which may include one or more cloud components in one or more networks. Where appropriate, one or more software upgrade systems 500 may perform without substantial spatial or temporal limitation one or more steps of one or more methods described or illustrated herein. As an example and not by way of limitation, one or more software upgrade systems

500 may perform in real time or in batch mode one or more steps of one or more methods described or illustrated herein. One or more software upgrade systems 500 may perform at different times or at different locations one or more steps of one or more methods described or illustrated herein, where appropriate.

In particular embodiments, software upgrade system 500 includes a processor 502, memory 504, storage 506, an input/output (I/O) interface 508, a communication interface 510, and a bus 512. Although this disclosure describes and illustrates a particular information handling system having a particular number of particular components in a particular arrangement, this disclosure contemplates any suitable information handling system having any suitable number of any suitable components in any suitable arrangement.

In particular embodiments, processor 502 includes hardware for executing instructions, such as those making up a computer program. As an example and not by way of limitation, to execute instructions, processor 502 may retrieve (or fetch) the instructions from an internal register, an internal cache, memory 504, or storage 506; decode and execute them; and then write one or more results to an internal register, an internal cache, memory 504, or storage 506. In particular embodiments, processor 502 may include one or more internal caches for data, instructions, or addresses. This disclosure contemplates processor 502 including any suitable number of any suitable internal caches, where appropriate. As an example and not by way of limitation, processor 502 may include one or more instruction caches, one or more data caches, and one or more translation lookaside buffers (TLBs). Instructions in the instruction caches may be copies of instructions in memory 504 or storage 506, and the instruction caches may speed up retrieval of those instructions by processor 502. Data in the data caches may be copies of data in memory 504 or storage 506 for instructions executing at processor 502 to operate on; the results of previous instructions executed at processor 502 for access by subsequent instructions executing at processor 502 or for writing to memory 504 or storage 506; or other suitable data. The data caches may speed up read or write operations by processor 502. The TLBs may speed up virtual-address translation for processor 502. In particular embodiments, processor 502 may include one or more internal registers for data, instructions, or addresses. This disclosure contemplates processor 502 including any suitable number of any suitable internal registers, where appropriate. Where appropriate, processor 502 may include one or more arithmetic logic units (ALUs); be a multi-core processor; or include one or more processors 502. Although this disclosure describes and illustrates a particular processor, this disclosure contemplates any suitable processor.

In particular embodiments, memory 504 includes main memory for storing instructions for processor 502 to execute or data for processor 502 to operate on. As an example and not by way of limitation, software upgrade system 500 may load instructions from storage 506 or another source (such as, for example, another software upgrade system 500) to memory 504. Processor 502 may then load the instructions from memory 504 to an internal register or internal cache. To execute the instructions, processor 502 may retrieve the instructions from the internal register or internal cache and decode them. During or after execution of the instructions, processor 502 may write one or more results (which may be intermediate or final results) to the internal register or internal cache. Processor 502 may then write one or more of those results to memory 504. In particular embodiments, processor 502 executes only instructions in one or more internal registers or internal caches or in memory 504 (as opposed to storage 506 or elsewhere) and operates only on data in one or more internal registers or internal caches or in memory 504 (as opposed to storage 506 or elsewhere). One or more memory buses (which may each include an address bus and a data bus) may couple processor 502 to memory 504. Bus 512 may include one or more memory buses, as described below. In particular embodiments, one or more memory management units (MMUs) reside between processor 502 and memory 504 and facilitate accesses to memory 504 requested by processor 502. In particular embodiments, memory 504 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 504 may include one or more memories 504, where appropriate. Although this disclosure describes and illustrates particular memory, this disclosure contemplates any suitable memory.

In particular embodiments, storage 506 includes mass storage for data or instructions. As an example and not by way of limitation, storage 506 may include a hard disk drive (HDD), a floppy disk drive, flash memory, an optical disc, a magneto-optical disc, magnetic tape, or a Universal Serial Bus (USB) drive or a combination of two or more of these. Storage 506 may include removable or non-removable (or fixed) media, where appropriate. Storage 506 may be internal or external to software upgrade system 500, where appropriate. In particular embodiments, storage 506 is non-volatile, solid-state memory. In particular embodiments, storage 506 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 506 taking any suitable physical form. Storage 506 may include one or more storage control units facilitating communication between processor 502 and storage 506, where appropriate. Where appropriate, storage 506 may include one or more storages 506. Although this disclosure describes and illustrates particular storage, this disclosure contemplates any suitable storage.

In particular embodiments, I/O interface 508 includes hardware, software, or both, providing one or more interfaces for communication between software upgrade system 500 and one or more I/O devices. Software upgrade system 500 may include one or more of these I/O devices, where appropriate. One or more of these I/O devices may enable communication between a person and software upgrade system 500. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 508 for them. Where appropriate, I/O interface 508 may include one or more device or software drivers enabling processor 502 to drive one or more of these I/O devices. I/O interface 508 may include one or more I/O interfaces 508, where appropriate. Although this disclosure describes and illustrates a particular I/O interface, this disclosure contemplates any suitable I/O interface.

In particular embodiments, communication interface 510 includes hardware, software, or both providing one or more interfaces for communication (such as, for example, packet-based communication) between software upgrade system 500 and one or more other software upgrade systems 500 or one or more networks. As an example and not by way of limitation, communication interface 510 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 510 for it. As an example and not by way of limitation, software upgrade system 500 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, software upgrade system 500 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network, a Long-Term Evolution (LTE) network, or a 5G network), or other suitable wireless network or a combination of two or more of these. Software upgrade system 500 may include any suitable communication interface 510 for any of these networks, where appropriate. Communication interface 510 may include one or more communication interfaces 510, where appropriate. Although this disclosure describes and illustrates a particular communication interface, this disclosure contemplates any suitable communication interface.

In particular embodiments, bus 512 includes hardware, software, or both coupling components of software upgrade system 500 to each other. As an example and not by way of limitation, bus 512 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 512 may include one or more buses 512, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In an embodiment, software upgrade system 500 may be configured to initiate a software upgrade process (see FIG. 1) in order to upgrade a physical switch. In an embodiment, software upgrade system 500 may be configured to receive a request to upgrade software for a switch. In an embodiment, software upgrade system 500 may be configured to use an ASIC simulator to generate a digital twin to store a first image and a first configuration of the switch. In an embodiment, software upgrade system 500 may be configured to use the digital twin to generate a second image and a second configuration by replaying the first configuration on the first image. In an embodiment, software upgrade system 500 may be configured to communicate the second image and the second configuration from the digital twin to an ASIC memory of an ASIC associated with the switch by applying batch DMA.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. An apparatus, comprising:

one or more processors; and one or more computer-readable non-transitory storage media comprising instructions that, when executed by the one or more processors, cause one or more components of the apparatus to perform operations comprising:

receiving a request to upgrade software for a switch;

generating, using an application-specific integrated circuit (ASIC) simulator, a digital twin to store a first image and a first configuration of the switch;

generating, using the digital twin, a second image and a second configuration by replaying the first configuration on the first image;

communicating the second image and the second configuration from the digital twin to an ASIC memory of an ASIC associated with the switch by applying batch direct memory access (DMA);

attempting to identify, by the digital twin, an anomaly while replaying the first configuration on the first image; and in response to identifying the anomaly:

determining that the second configuration is an American Standard Code for Information Interchange (ASCII) configuration; and generating, using the digital twin, the second image by replaying the second configuration on the first image.

2. The apparatus of claim 1, the operations further comprising:

in response to receiving the request to update the software for the switch, issuing a command to reload the digital twin with the first image and the first configuration on the switch.

3. The apparatus of claim 1, the operations further comprising:

in response to not identifying the anomaly, determining that the second configuration is a binary configuration.

4. The apparatus of claim 1, wherein:

the first configuration is a binary configuration, and the second image and the second configuration are stored in a virtual shadow memory of the digital twin.

5. The apparatus of claim 4, the operations further comprising:

performing, by the digital twin, batch DMA to transfer the second image and the second configuration stored in the virtual shadow memory of the digital twin to the ASIC memory of the ASIC associated with the switch once replaying the first configuration is complete.

6. The apparatus of claim 5, the operations further comprising:

applying a workflow to receive the second image and the second configuration from the digital twin, the workflow comprising:

resetting the ASIC memory and disconnecting a software development kit (SDK) of the software for the switch from the ASIC to shut down a data plane and a control plane of the switch; and reloading an ASIC microcode and performing batch DMA to transfer the virtual shadow memory received from the digital twin to the ASIC memory.

7. The apparatus of claim 6, the operations further comprising:

replaying the second configuration to reload the switch with the second image;

connecting the control plane to the software on the switch; and connecting the SDK of the software for the switch to the ASIC.

8. The apparatus of claim 7, the operations further comprising:

terminating the digital twin after reloading the switch with the second image.

9. A computer-implemented method, comprising:

receiving a request to upgrade software for a switch;

generating, using an application-specific integrated circuit (ASIC) simulator, a digital twin to store a first image and a first configuration of the switch;

generating, using the digital twin, a second image and a second configuration by replaying the first configuration on the first image;

communicating the second image and the second configuration from the digital twin to an ASIC memory of an ASIC associated with the switch by applying batch direct memory access (DMA);

attempting to identify, by the digital twin, an anomaly while replaying the first configuration on the first image; and in response to identifying the anomaly:

determining that the second configuration is an American Standard Code for Information Interchange (ASCII) configuration; and generating, using the digital twin, the second image by replaying the second configuration on the first image.

10. The computer-implemented method of claim 9, further comprising:

in response to receiving the request to update the software for the switch, issuing a command to reload the digital twin with the first image and the first configuration on the switch.

11. The computer-implemented method of claim 9, further comprising:

in response to not identifying the anomaly, determining that the second configuration is a binary configuration.

12. The computer-implemented method of claim 9, wherein:

the first configuration is a binary configuration, and the second image and the second configuration are stored in a virtual shadow memory of the digital twin.

13. The computer-implemented method of claim 12, further comprising:

performing, by the digital twin, batch DMA to transfer the second image and the second configuration stored in the virtual shadow memory of the digital twin to the ASIC memory of the ASIC associated with the switch once replaying the first configuration is complete.

14. The computer-implemented method of claim 13, further comprising:

applying a workflow to receive the second image and the second configuration from the digital twin, the workflow comprising:

resetting the ASIC memory and disconnecting a software development kit (SDK) of the software for the switch from the ASIC to shut down a data plane and a control plane of the switch;

reloading an ASIC microcode and performing batch DMA to transfer the virtual shadow memory received from the digital twin to the ASIC memory; and terminating the digital twin after reloading the switch with the second image.

15. The computer-implemented method of claim 14, further comprising:

replaying the second configuration to reload the switch with the second image;

connecting the control plane to the software on the switch; and connecting the SDK of the software for the switch to the ASIC.

16. A non-transitory computer-readable medium comprising instructions that are configured, when executed by a processor, to:

receive a request to upgrade software for a switch;

generate, using an application-specific integrated circuit (ASIC) simulator, a digital twin to store a first image and a first configuration of the switch;

generate, using the digital twin, a second image and a second configuration by replaying the first configuration on the first image;

communicate the second image and the second configuration from the digital twin to an ASIC memory of an ASIC associated with the switch by applying batch direct memory access (DMA);

attempt to identify, by the digital twin, an anomaly while replaying the first configuration on the first image; and in response to identifying the anomaly:

determining that the second configuration is an American Standard Code for Information Interchange (ASCII) configuration; and generating, using the digital twin, the second image by replaying the second configuration on the first image.

* * * * *